US010578745B2

(12) United States Patent
Sasahara

(10) Patent No.: US 10,578,745 B2
(45) Date of Patent: Mar. 3, 2020

(54) POSITIONING SIGNAL RECEIVING METHOD AND POSITIONING SIGNAL RECEIVING DEVICE

(71) Applicant: Seiko Epson Corporation, Tokyo (JP)

(72) Inventor: Hideo Sasahara, Matsumoto (JP)

(73) Assignee: Seiko Epson Corporation (JP)

(*) Notice: Subject to any disclaimer, the term of this patent is extended or adjusted under 35 U.S.C. 154(b) by 720 days.

(21) Appl. No.: 14/863,582

(22) Filed: Sep. 24, 2015

(65) Prior Publication Data

US 2016/0011316 A1 Jan. 14, 2016

Related U.S. Application Data

(63) Continuation of application No. PCT/JP2014/001552, filed on Mar. 18, 2014.

(30) Foreign Application Priority Data

Mar. 28, 2013 (JP) .................. 2013-068741

(51) Int. Cl.
*G01S 19/24* (2010.01)
*H04L 1/00* (2006.01)
*H03M 13/09* (2006.01)

(52) U.S. Cl.
CPC ............ *G01S 19/24* (2013.01); *G01S 19/243* (2013.01); *H04L 1/00* (2013.01); *H03M 13/098* (2013.01); *H04L 1/0063* (2013.01)

(58) Field of Classification Search
CPC .................................................. G01S 19/243
(Continued)

(56) References Cited

U.S. PATENT DOCUMENTS 5,768,319 A 6/1998 Durboraw, III
7,391,677 B2 6/2008 Urano et al.
(Continued)

FOREIGN PATENT DOCUMENTS

JP 61-198077 A 9/1986
JP 11-223669 A 8/1999
(Continued)

OTHER PUBLICATIONS

GPS NAVSTAR Global Positioning System, "Global Positioning System Standard Positioning Service Singnal Specification", 2nd Edition (Year: 1995).*
(Continued)

*Primary Examiner* — Vladimir Magloire
*Assistant Examiner* — Helena H Seraydaryan
(74) *Attorney, Agent, or Firm* — Harness, Dickey & Pierce, P.L.C.

(57) ABSTRACT

A positioning signal receiving method includes receiving a positioning signal by which unit data that includes sequence information of navigation message data and one or more error detection information is sequentially transmitted, performing a first determination that determines whether or not an error occurs in first received unit data, based on the error detection information that is included in the first received unit data performing a second determination that determines whether or not an error occurs in second received unit data, based on the error detection information that is included in the second received unit data, if it is determined that an error occurs according to the first determination, and determining that the sequence information of the second received unit data or the sequence information of the first received unit data is correct, if it is determined that an error does not occur according to the second determination.

6 Claims, 4 Drawing Sheets

(58) Field of Classification Search
USPC .................................................. 342/357.63
See application file for complete search history.

(56) References Cited

U.S. PATENT DOCUMENTS

| | | |
|---|---|---|
| 7,636,060 B2 | 12/2009 | Li et al. |
| 7,778,775 B2 | 8/2010 | Okada et al. |
| 2006/0126762 A1* | 6/2006 | Tapucu ................. G01S 19/243 375/340 |
| 2009/0021427 A1* | 1/2009 | Tsai ....................... G01S 19/235 342/357.62 |
| 2010/0045527 A1 | 2/2010 | Li et al. |

FOREIGN PATENT DOCUMENTS

| | | |
|---|---|---|
| JP | 2000-056007 A | 2/2000 |
| JP | 2007-309651 A | 11/2007 |
| JP | 2008-032638 A | 2/2008 |
| JP | 2008-170435 A | 7/2008 |

OTHER PUBLICATIONS

K. Harima et al., "Radio Communication Systems", IEICE Technical Report, The Institute of Electronics, Information and Communication Engineers, vol. 111, No. 289, Nov. 16, 2011, pp. 25-31, with English translation.

* cited by examiner

POSITIONING SIGNAL RECEIVING METHOD AND POSITIONING SIGNAL RECEIVING DEVICE

The entire disclosure of Japanese Patent Application No. 2013-068741, filed Mar. 28, 2013, and PCT Application No. PCT/JP2014/001552, filed Mar. 18, 2014 are hereby expressly incorporated by reference herein.

BACKGROUND

1. Technical Field

The present disclosure relates to a method of receiving a positioning signal, or the like.

2. Related Art

As a positioning system using a positioning signal, a global positioning system (GPS) is widely known, and the GPS is used for a receiving device which is embedded in a mobile phone, a car navigation device, or the like. The GPS calculates a position of a plurality of GPS satellites, a pseudo distance from each GPS satellite to a receiving device, or the like, using a measured time of a GPS receiver, and finally performs a positional calculation.

A GPS satellite includes information on a satellite orbit, times, or the like in a navigation message, and transmits the navigation message at a bit rate of 50 bit per second (bps). The navigation message is configured in a data unit, such as a master frame, a frame, a subframe, or a word.

In order to acquire a navigation message from a received GPS satellite signal, sequence information on whether or not a signal which is currently received corresponds to which portion of the navigation message has to be specified from results in which a received signal is demodulated. Specifically, after sequence information, such as a page number of a navigation message, a subframe number, or a word number is specified, data which is demodulated based on the sequence information is combined, and thereby navigation message data can be acquired (for example, JP-A-2008-32638).

SUMMARY

However, there is a high probability that incorrect demodulation of the received signal may be performed due to a weak received signal, under a weak electric field environment, and thus, there is a case in which it is not easy to specify sequence information of a navigation message. In this case, a GPS satellite signal has to be repeatedly received, until sequence information is specified. For this reason, there is a problem that a long time is required to acquire a navigation message, and time to first fix (TTFF) is increased.

An advantage of some aspects of the disclosure is to propose a novel technology for specifying sequence information of data which is transferred by a positioning signal in a short time.

According to a first disclosure, a positioning signal receiving method included receiving a positioning signal by which unit data that includes sequence information of navigation message data and one or more error detection information is sequentially transmitted; performing a first determination that determines whether or not an error occurs in first received unit data, based on the error detection information that is included in the first received unit data which is first unit data that is received; performing a second determination that determines whether or not an error occurs in second received unit data that is second unit data which is received and is adjacent to the first unit data, based on the error detection information that is included in the second received unit data, in a case in which it is determined that an error occurs according to the first determination; and determining that the sequence information of the second received unit data or the sequence information of the first received unit data is correct, in a case in which it is determined that an error does not occur according to the second determination.

In addition, as another aspect of the disclosure, a positioning signal receiving device may be configured which includes a receiving circuit that receives a positioning signal by which unit data that includes sequence information of navigation message data and one or more error detection information is sequentially transmitted; a first determiner that performs a first determination that determines whether or not an error occurs in first received unit data, based on the error detection information that is included in the first received unit data which is first unit data that is received; a second determiner that performs a second determination that determines whether or not an error occurs in second received unit data that is second unit data which is received and is adjacent to the first unit data, based on the error detection information that is included in the second received unit data, in a case in which it is determined that an error occurs according to the first determination; and a determiner that determines that the sequence information of the second received unit data or the sequence information of the first received unit data to be correct, in a case in which it is determined that an error does not occur according to the second determination.

According to the first aspect of the disclosure or the like, even in a case in which there is an error as a result of the first determination, in a case in which there is no error as a result of the second determination, the sequence information of the second received unit data or the sequence information of the first received unit data is determined to be correct, and thereby it is possible to specify the sequence information which is included in the positioning signal in a short time.

In addition, as a second aspect of the disclosure, a positioning signal receiving method may be configured which, in the positioning signal receiving method of the first aspect of the disclosure, further includes acquiring the navigation message data that is transferred to the positioning signal, by sequentially combining the unit data that is received, based on the sequence information which is determined to be correct.

According to the second aspect of disclosure, by sequentially combining the unit data that is received, based on the sequence information that is determined to be correct, the navigation message data that is transferred to the positioning signal can be acquired.

In addition, as a third aspect of disclosure, in the positioning signal receiving method of the first or second aspect of disclosure, a positioning signal receiving method may be configured which includes performing sequence determination that determines whether or not sequence information which is included in the first received unit data, and sequence information which is included in the second received unit data satisfy a predetermined sequence condition, in a case in which there is a determination result in which both the first determination and the second determination determine that an error occurs, and determining the sequence information of the first received unit data and the second received unit data to be correct, in a case in which it is determined that the sequence condition is satisfied by the sequence determination.

According to the third aspect of the disclosure, in a case in which there is a determination result in which both the first determination and the second determination determine that an error occurs, the sequence determination is performed that determines whether or not the sequence information which is included in the first received unit data, and sequence information which is included in the second received unit data satisfy a predetermined sequence condition. Ina case in which it is determined that the sequence condition is satisfied by the sequence determination, even if there is an error as an error detection result, the sequence information of both the first received unit data and the second received unit data is determined to be correct. As a result, it is possible to rescue received unit data in which it is determined that an error occurs, and to specify the sequence information in a short time.

In addition, as a fourth aspect of the disclosure, a positioning signal receiving method may be configured which includes, in the positioning signal receiving method of any one of the first to third aspects of the disclosure, the receiving includes storing data which is received in a ring buffer having a capacitor in which at least two pieces of the unit data can be stored.

According to the fourth aspect of the disclosure, the received data is stored in the ring buffer having a capacitor in which at least two pieces of the unit data can be stored, and thereby it is possible to perform the second determination by setting the second received unit data adjacent to the first received unit data as a target.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, an example of a preferred embodiment to which the disclosure is applied will be described. The embodiment related to a method (method of receiving a positioning signal) of receiving a GPS satellite signal which is a type of positioning signal, using a global positioning system (GPS) which is a type of satellite positioning system and a device (positioning signal receiving device) thereof. As an example of an electronic apparatus which includes a positioning signal receiving device, an embodiment in a case in which the disclosure is applied to a mobile phone will be described. However, it is needless to say that a form to which the disclosure can be applied is not limited to the embodiment which will be described hereinafter.

1. Configuration 1-1. Configuration of Mobile Phone

Figure 1:
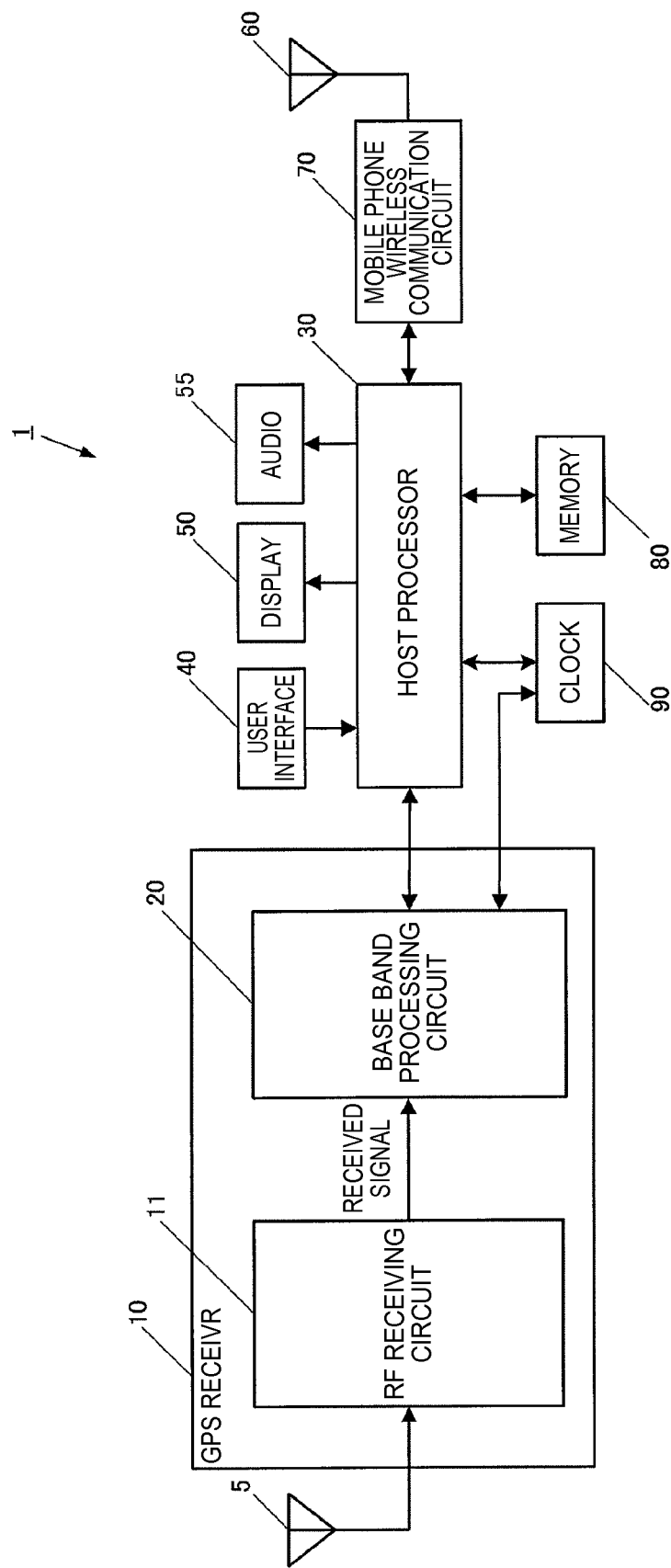
FIG. 1 is a diagram illustrating an example of a functional configuration of a mobile phone.

FIG. 1 is a block diagram illustrating an example of a functional configuration of a mobile phone 1 according to the present embodiment. The mobile phone 1 is configured to include a GPS antenna 5, a GPS receiver 10, a host processor 30, an user interface 40, a display 50, a audio 55, a mobile phone antenna 60, a mobile phone wireless communication circuit 70, a memory 80, and a clock 90.

The GPS antenna 5 is an antenna which receives a radio frequency (RF) signal including a GPS satellite signal that is transmitted from a GPS satellite and outputs the received signal to the GPS receiver 10.

The GPS receiver 10 is a circuit or a device which calculates a position of the mobile phone 1, based on a signal which is output from the GPS antenna 5, and is a functional block corresponding to a so-called GPS receiver. In the present embodiment, the GPS receiver 10 corresponds to a positioning signal receiving device.

The GPS receiver 10 is configured to include an RF receiving circuit 11 and a base band processing circuit 20. The RF receiving circuit 11 and the base band processing circuit 20 can also be manufactured as large scale integrations (LSI) different from each other, and can also be manufactured as one chip.

The RF receiving circuit 11 is a circuit for receiving an RF signal, and corresponds to a receiving circuit which receives a GPS satellite signal that transfers a navigation message. As a circuit configuration of the RF receiving circuit 11, for example, a receiving circuit which processes a digital signal that is converted from an RF signal which is output from the GPS antenna 5 by an A/D converter may be configured. In addition, a configuration in which an RF signal that is output from the GPS antenna 5 is processed as an analog signal and is finally converted into a digital signal, and thereby the digital signal is output to the base band processing circuit 20, may be used.

The base band processing circuit 20 detects a GPS satellite signal by performing a carrier removal, a correlation calculation, or the like, with respect to a received signal of the GPS satellite signal which is received by the RF receiving circuit 11. Then, a position or a clock error of the mobile phone 1 is calculated by using time information, satellite orbit information, or the like which is extracted from the GPS satellite signal.

The host processor 30 is a processor which comprehensively controls each unit of the mobile phone 1 according to various programs such as a system program which is stored in the memory 80, and is configured to include a processor such as a central processing unit (CPU). The host processor 30 displays a map indicating a current position on the display 50, and uses position coordinates thereof for various application processing, based on position coordinates that are extracted from the base band processing circuit 20.

The user interface 40 is an input device which is configured to include, for example, a touch panel, button switches, or the like, and a signal of a key or button which is pressed is output to the host processor 30. By an operation of the user interface 40, various instruction inputs, such as a call request, an e-mail sending and receiving request, various application execution requests, or a position calculation request, are performed.

The display 50 is a display device which is configured to include a liquid crystal display (LCD) or the like, and performs various displays based on a display signal which is output from the host processor 30. A position display screen, time information, or the like is displayed on the display 50.

The audio 55 is a sound output device which is configured to include a speaker or the like, and performs various sound outputs based on a sound output signal which is output from the host processor 30. A voice during a call, audio guidance regarding various applications, or the like is output from the audio 55.

The mobile phone antenna 60 is an antenna which performs transmission and reception of a mobile phone wireless signal to and from wireless base stations which are established by a communication service provider of the mobile phone 1.

The mobile phone wireless communication circuit 70 is a communication circuit of a mobile phone which is configured by an RF conversion circuit, a base band processing circuit, or the like, and realizes a phone call, transmission and reception of emails, or the like, by performing modulation and demodulation, or the like of a mobile phone wireless signal.

The memory 80 is configured to include a storage device, such as a read only memory (ROM), a flash ROM, or a random access memory (RAM), and stores a system program for controlling the mobile phone 1 using the host processor 30, various programs for implementing various application processing, data, or the like.

The clock 90 is an internal clock of the mobile phone 1, and is configured to include a quartz crystal oscillator, or the like which is configured by a quartz crystal vibrator and an oscillation circuit. Measured times of the clock 90 are output to the base band processing circuit 20 and the host processor 30. A time which is measured by the clock 90 is corrected based on a clock error which is calculated by the base band processing circuit 20.

1-2. Circuit Configuration of Base Band Processing Circuit

Figure 2:
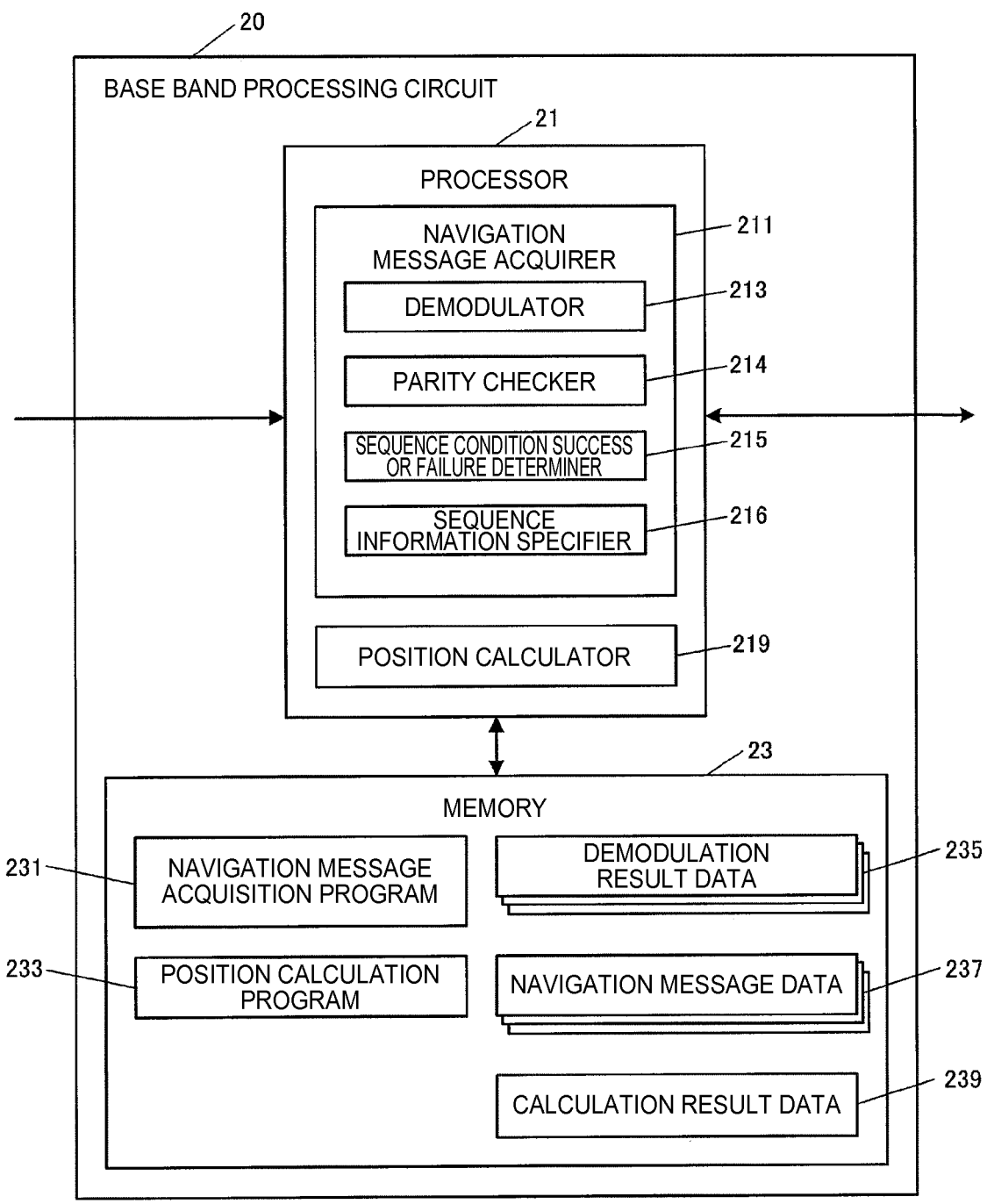
FIG. 2 is a diagram illustrating an example of a circuit configuration of a base band processing circuit.

FIG. 2 is a diagram illustrating an example of a circuit configuration of a base band processing circuit 20, and is a diagram illustrating with focus on a circuit block according to the present example. The base band processing circuit 20 includes a processor 21 and a memory 23 as a main configuration.

The processor 21 is a control device which comprehensively controls each functional unit of the base band processing circuit 20 and a calculation device, and is configured to include a processor such as a CPU or a digital signal processor (DSP). The processor 21 includes a navigation message acquirer 211 and a position calculator 219 as a main functional unit.

In the present embodiment, the navigation message acquirer 211 includes a demodulator 213, a parity checker 214, a sequence condition success or failure determiner 215, and a sequence information specifier 216. However, the functional units are simply described as an example, and all these functional units are not necessarily used as essential configuration elements. In addition, it is needless to say that a functional unit other than these may be added as an essential configuration element.

The demodulator 213 demodulates a received signal of a GPS satellite signal which is received by the RF receiving circuit 11. In the present embodiment, data which is demodulated by the demodulator 213 is referred to as "demodulation data". In a case in which the received signal is correctly demodulated, the demodulation data becomes the data of a navigation message. For the navigation message, data is transferred in a transfer data unit which is referred to as a word. A word is a type of predetermined transfer data unit according to a data format of the navigation message. In the present embodiment, the demodulation data of a word unit in the demodulation data is referred to as "demodulated word data".

The parity checker 214 performs parity check processing with regard to the demodulated word data. With regard to the demodulated word data, parity check processing is first performed. In the parity check processing, a parity check for the demodulated word data is performed according to a calculation formula for parity check which is regulated in advance. Since the calculation formula of a parity check which is regulated in a GPS is known, description thereof will be omitted hereinafter. In the present embodiment, the parity checker 214 corresponds to a first determiner which performs a first determination and a second determiner which performs a second determination.

The sequence condition success or failure determiner 215 determines whether or not a predetermined sequence condition is satisfied, based on TOW count which is included in a hand over word (HOW) in the demodulated word data. Detailed description will be made later.

The sequence information specifier 216 specifies sequence information of the word data which is demodulated, based on a result of parity processing which is performed by the parity checker 214, and a determination result of the sequence condition success or failure determiner 215. The sequence information specifier 216 corresponds to a determiner which determines that sequence information of second received unit data is correct, in a case in which it is determined that an error does not occur according to the second determination.

Navigation data which is transmitted by a GPS satellite is configured by one master frame, and one master frame is configured by 25 frames of 1500 bits. Each frame is configured by five subframes (first subframe to fifth subframe). Each subframe is configured by 10 words (first word to tenth word). In the present embodiment, a subframe corresponds to unit data which includes sequence information and one or more error detection information.

In each subframe, a first word is referred to as a telemetry (TLM) word, and includes a preamble of 8 bits which is a synchronization pattern, a TLM message of 14 bits, and parities of 6 bits for symbol checking. In the present embodiment, the parities of 6 bits which are included in each word correspond to error detection information.

The second word is referred to as a hand over word (HOW), and includes time corresponding information of 17 bits which is referred to as time of week (TOW) count, a subframe ID of three bits which indicates the number of a subframe, and a parity bit of 6 bits for symbol checking. In the present embodiment, the subframe ID corresponds to sequence information. Hereinafter, the hand over word is referred to as a "HOW".

The TOW count is a count corresponding to the number of epochs of an amount of one week, and is referred to as a Z count. In the present specification, in a case in which "TOW count" is described, the TOW count indicates in principle a TOW count of 17 bits which is stored in the HOW.

The position calculator 219 performs a predetermined position calculation processing using a navigation message which is acquired by the navigation message acquirer 211 with regard to each satellite which is detected, and measurement information which is acquired with regard to each satellite which is detected, and thereby calculates a position (position coordinates) of the mobile phone 1 and a clock error (clock bias). The position calculation processing can be executed by processing to which, for example, a least squares method, or a technology such as Kalman filtering is applied, and is known, and thus description thereof will be omitted in the present specification.

The memory 23 stores a system program of the base band processing circuit 20, various programs for realizing various functions such as a satellite detection function, a navigation message acquisition function, and a position calculation function, data, or the like. In addition, the memory 23 has a work area in which data being processed in various processings, processing results, or the like is temporarily stored.

The memory 23 stores a navigation message acquisition program 231 which is executed as navigation message acquisition processing (refer to FIG. 3) by the navigation message acquirer 211, and a position calculation program 233 which is executed as position calculation processing by the position calculator 219 as a program. The navigation message acquisition processing will be described later using a flowchart.

In addition, the memory 23 stores demodulation result data 235, navigation message data 237, and calculation result data 239.

The demodulation result data 235 is data in which demodulation data that is demodulated by the demodulator 213 is stored in each GPS satellite. A storage area of the demodulation result data 235 is configured as a ring buffer having a capacitor in which at least two subframes of the navigation message can be stored. As a result, it is possible to store demodulation data of at least two consecutive subframes.

The navigation message data 237 is data in which navigation messages that are acquired by the navigation message acquirer 211 are stored in each GPS satellite.

The calculation result data 239 is data which is a calculation result that is required by performing position calculation processing using the position calculator 219, and a position and a clock error of the mobile phone 1 which are calculated are included in the calculation result data 239.

2. Flow of Processing

Figure 3:
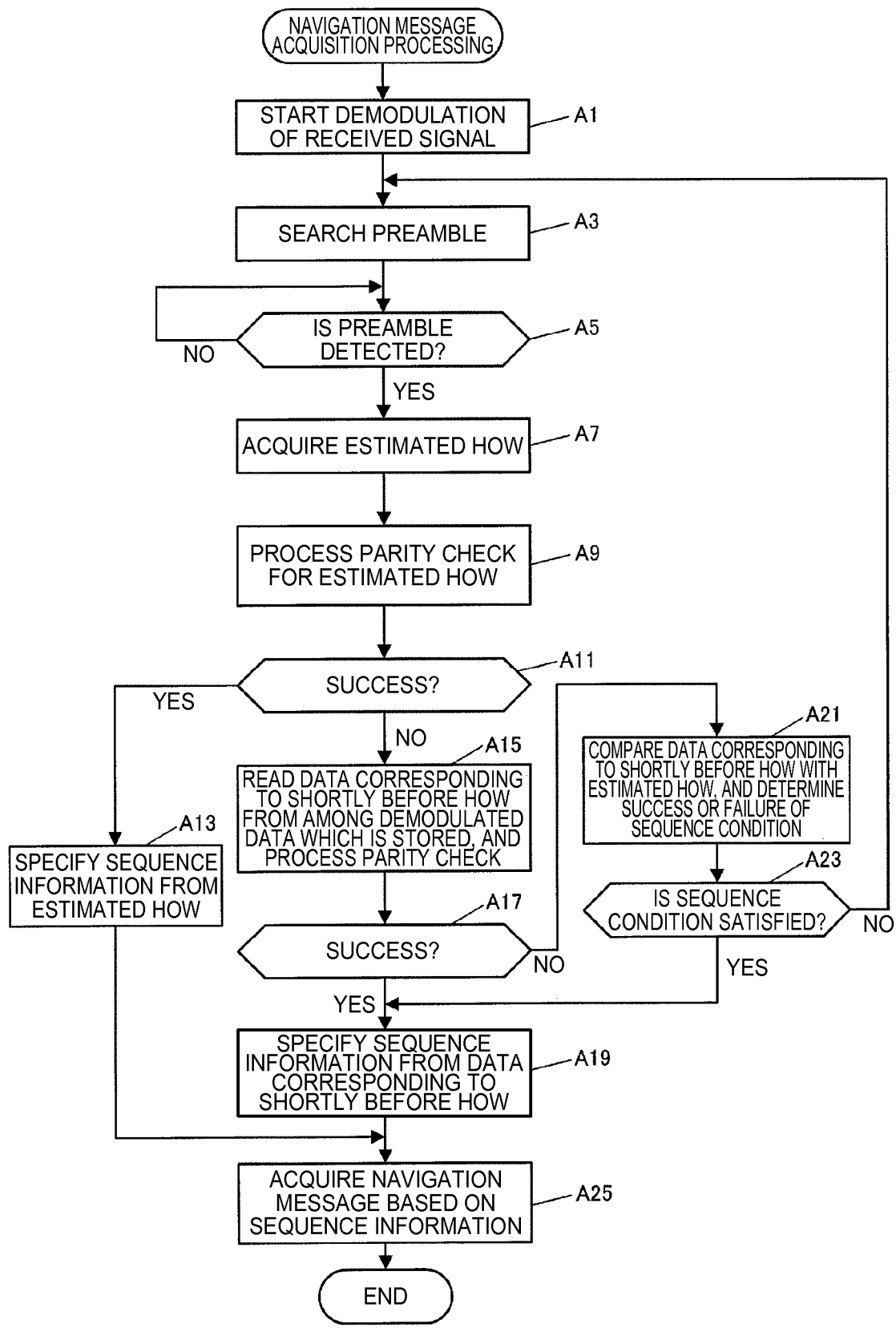
FIG. 3 is a flowchart illustrating a flow of navigation message acquisition processing.

FIG. 3 is a flowchart illustrating a flow of navigation message acquisition processing which is performed by the processor 21 according to the navigation message acquisition program 231.

firstly, the demodulator 213 starts demodulation of a received signal (step A1). The demodulation is also subsequently and continually performed. Then, the demodulator 213 performs a preamble search (step A3). A preamble bit is stored in the prefix part in a TLM which is a first word of each subframe of a navigation message. The preamble bit is searched for.

If the preamble can be detected (step A5; Yes), the processor 21 acquires a data part (hereinafter, referred to as "estimated HOW") which is estimated to be a HOW (step A7). Then, the parity checker 214 performs parity check processing for the demodulation data of the estimated HOW (step 9). The parity check processing of step A9 corresponds to performing the first determination which determines whether or not an error occurs in first received unit data, based on error detection information which is included in the first received unit data that is first unit data which is received.

If a result of the parity check processing of step A9 is satisfied (no error is detected) (step A11; Yes), the sequence information specifier 216 specifies sequence information from the demodulation data of the estimated HOW (step A13). That is, the subframe ID which is stored in the estimated HOW is detected as the sequence information. Then, the processing proceeds to step A25.

If a result of the parity check processing of step A9 is not satisfied (error is detected) (step A11; No), the processor 21 reads the data corresponding to the HOW (hereinafter, referred to as "immediately before HOW") of the subframe of one piece before, from the demodulation data which is stored in a ring buffer of the memory 23 and performs the parity check processing (step A15). In a case in which it is determined that an error occurs according to the first determination, the parity check processing of step A15 corresponds to performing the second determination which determines whether or not an error occurs in second received unit data in which the second unit data adjacent to the first unit data is received, based on the error detection information which is included in the second received unit data.

If a result of the parity check processing of step A15 is satisfied (no error is detected) (step A17; Yes), the sequence information specifier 216 specifies sequence information from data corresponding to the immediately before HOW (step A19). That is, the subframe ID is detected as the sequence information from the data corresponding to the immediately before HOW. This corresponds to that in which the sequence information of the second received unit data is determined to be correct, in a case in which it is determined that an error does not occur according to the second determination.

If a result of the parity check processing of step A15 is not satisfied (error is detected) (step A17; No), the sequence condition success or failure determiner 215 compares TOW count and the subframe ID of the data corresponding to the immediately before HOW with TOW count and the subframe ID of the estimated HOW, and determines whether or not a sequence condition is satisfied (step A21). That is, the sequence condition success or failure determiner 215 determines whether or not the TOW count and the subframe ID which are obtained from the demodulation data of HOW of consecutive subframes are consecutive.

In a case in which the sequence condition is not satisfied (step A23; No), the processor 21 returns to step A3. Meanwhile, in a case in which the sequence condition is satisfied (step A23; Yes), the processor 21 proceeds to step A19.

After step A13 or A19, the processor 21 acquires a navigation message based on specified sequence information (step A25). Since the subframe ID is stored in a HOW which is the second word, if the subframe ID can be specified and detected, a word number can be naturally seen. Also, a page number is allocated to the frame configured by the five subframe. Thus, demodulation data is sequentially combined based on the specified sequence information, and thereby the navigation message data 237 which is transferred to a GPS satellite signal can be acquired. The processor 21 stores the acquired navigation message data 237 in the memory 23, and thereafter the navigation message acquisition processing is ended.

3. Experimental Results

An experiment in which sequence information (subframe ID) of a navigation message which is transferred to a GPS satellite signal using a technology of the present embodiment is specified and a navigation message is acquired has been performed. Experimental results will be described.

Figure 4:
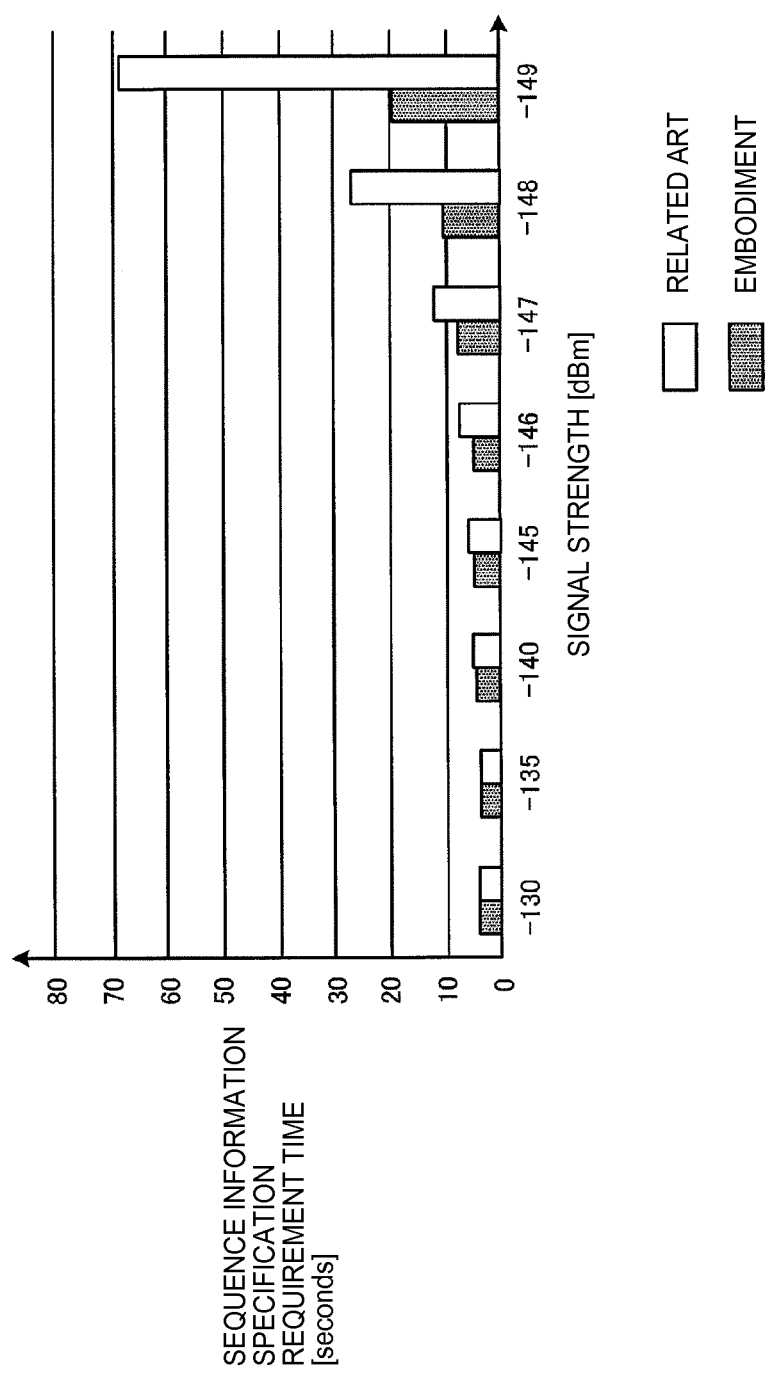
FIG. 4 is a diagram illustrating an example of experimental results.

FIG. 4 is a diagram illustrating an example of experimental results which are obtained by performing an experiment in which sequence information is specified by using a technology of the related art and the technology of the present embodiment. An experiment has been performed for measuring a time (hereinafter, referred to as "sequence information specification requirement time") that is needed until sequence information is specified while a signal strength of the received signal of a GPS satellite signal is changed. In FIG. 4, a horizontal axis is a signal strength (unit is [dBm]), and a vertical axis is sequence information specification requirement time (units are [seconds]).

From the experimental results, it can be seen that, as a signal strength of a received signal becomes weak, effects of the technology of the present embodiment are remarkably improved. For example, in a case in which a signal strength is −148 [dBm], while a sequence information specification requirement time in a case of using a technology of the related art is approximately 27 seconds, a sequence information specification requirement time in a case of using a technology of the present embodiment is approximately 10 seconds. In addition, in a case in which a signal strength is −149 [dBm], while a sequence information specification requirement time in a case of using a technology of the related art is approximately 70 seconds, a sequence information specification requirement time in a case of using a technology of the present embodiment is approximately 20 seconds. From the experimental results, it can be seen that sequence information can be specified in a short time, by using a technology of the present embodiment.

4. Effects

The RF receiving circuit 11 of the GPS receiver 10 receives a GPS satellite signal (positioning signal) by which subframes (unit data) that contain the subframe ID (sequence information) and one or more parity bit (error detection information) are sequentially transmitted. Based on a parity bit which is included in the first received subframe (first received unit data) that is the first subframe which is received, the parity checker 214 performs the first determination which determines whether or not an error occurs in the first received subframe. In addition, in a case in which it is determined that an error occurs according to the first determination, the parity checker 214 performs the second determination which determines whether or not an error occurs in the second received subframe (second received unit data) that is obtained by receiving the second subframe which is one subframe before the first subframe, based on the parity bit that is included in the second received subframe. Then, in a case in which it is determined that an error does not occur according to the second determination, the sequence information specifier 216 determines that the subframe ID of the second subframe is correct.

Even in a case in which it is determined that there is an error according to the first determination, in a case in which it is determined that there is no error according to the second determination, the subframe ID is specified from the second subframe, and thereby the subframe ID can be specified in a short time. In addition, a word number is specified based on the subframe ID which is determined to be correct, the received data is sequentially combined using the information and a page number, and thereby it is possible to acquire the navigation message data which is transferred to the GPS satellite signal. If sequence information can be specified in a short time, the navigation message can be acquired in a short time, and TIFF is shortened. As can be seen from the experimental results, a GPS satellite signal receiving method of the present embodiment is particularly useful in a weak electric field environment.

In addition, in a case in which both the first determination and the second determination determine that an error occurs, the sequence condition success or failure determiner 215 performs sequence determination regarding whether or not both the TOW count and the subframe ID which are included in the first received subframe, and the TOW count and the subframe ID which are included in the second received subframe satisfy a predetermined sequence condition. Then, in a case in which it is determined that a sequence condition is satisfied by the sequence determination, the subframe IDs of both the first subframe and the second subframe are determined to be correct. As a result, it is possible to rescue a received subframe for which it is determined that there is an error by the error detection, and to specify the subframe ID.

5. Modification Example

An example to which the disclosure can be applied is not limited to the examples described above, and it is needless to say that an appropriate modification can be made within a range without departing from the scope of the disclosure.

5-1. Unit Data

In the embodiments described above, unit data is described as a subframe of the navigation message of a GPS, but it is needless to say that the unit data is not limited to this. In a case in which the disclosure is applied to a satellite positioning system other than a GPS, if data includes sequence information and one or more error detection information, it is possible to set the data as unit data, and to specify the sequence information using the same technology as in the embodiments described above.

In addition, the error detection information is not limited to a parity bit, and it is needless to say that other error detection symbols may be set as error detection information.

5-2. Electronic Apparatus

In the examples described above, a case in which the disclosure is applied to a mobile phone which is a type of electronic apparatus is described as an example, but an electronic apparatus to which the disclosure can be applied is not limited to this. For example, the disclosure can be applied in the same manner to other electronic apparatus, such as a car navigation device, a mobile navigation device, a personal computer, a personal digital assistant (PDA), or a watch.

5-3. Subject of Processing

In the examples described above, description is made in which all the processing regarding acquisition of a navigation message is performed by the processor 21 of the base band processing circuit 20, but a portion or all of the processing may be performed by the host processor 30 of an electronic apparatus. In addition, as demodulation of a received signal or parity check processing is performed by the processor 21 of the base band processing circuit 20, and success or failure determination of a sequence condition, or specification of sequence information is performed by the host processor 30, processing may be dispersed by the base band processing circuit 20 and the host processor 30.

5-4. Satellite Positioning System

In addition, in the embodiments described above, a GPS is exemplified as a satellite positioning system, but a satellite positioning system, such as a wide area augmentation system (WAAS), a quasi zenith satellite system (QZSS), a global navigation satellite system (GLONASS), or GALILEO may be used.

5-5. Determination of Sequence Condition

In the embodiments described above, description is made in which the TOW count and the subframe ID of data corresponding to the immediately before HOW are compared with the TOW count and the subframe ID of the estimated HOW, and thereby whether or not a sequence condition is satisfied is determined. However, determination regarding whether or not a sequence condition is satisfied need not have to be performed by setting both the TOW count and the subframe ID as a target. Determination regarding whether or not the sequence condition is satisfied may be performed by setting only the TOW count as a target, and determination regarding whether or not the sequence condition is satisfied may be performed by setting only the subframe ID as a target.

5-6. Second Determination

In the embodiments described above, description is made in which the second determination is performed using the estimated HOW of the current subframe and the HOW of an adjacent subframe, such as the HOW of the subframe immediately before the current subframe (i.e., the HOW of the subframe of one piece before, or the "immediately before HOW" as described above) or the HOW of the subframe immediately after the current subframe.

5-7. Correction Determination of Subframe ID of Received Unit Data

In the embodiments described above, in a case in which it is determined that an error dose not occur according to the second determination, a case in which the sequence information specifier 216 determines that the subframe ID of the second received unit data is correct is described as an example. However, in a case in which it is determined that an error dose not occur according to the second determination, the sequence information specifier 216 may determine that the subframe ID of the first received unit data is correct.

What is claimed is:

1. A positioning signal receiving method comprising:
   receiving a positioning signal by which subframes that include subframe identifiers of navigation message data and parity information are sequentially transmitted, wherein the subframe identifiers indicate a sequence of the subframes, and wherein each of the subframes corresponds to at least one word including a preamble, a message, and parity bits;
   in response to acquiring a first word of a first received subframe, performing a first determination that determines whether or not an error occurs in the first word of the first received subframe based on the parity information that is included in the first received subframe;
   in response to acquiring a second word of a second received subframe and in response to a determination that an error occurs in the first word, performing a second determination that determines whether or not an error occurs in the second word of the second received subframe based on the parity information that is included in the second received subframe, the second subframe being a subframe that is immediately next to the first subframe;
   determining that the subframe identifier of the second received subframe is correct if it is determined that an error does not occur according to the second determination; and
   acquiring a remainder of a navigation message based on the second subframe in response to the determination that the subframe identifier of the second received subframe is correct.

2. The positioning signal receiving method according to claim 1, further comprising:
   acquiring navigation message data that is transferred by the positioning signal by combining one of the first subframe and the second subframe that is received based on whether the second subframe identifier is determined to be correct.

3. The positioning signal receiving method according to claim 1, further comprising:
   if the determination result of the first determination indicates that an error occurs in the first received subframe and the determination result of the second determination indicates that an error occurs in the second received subframe,
   performing sequence determination that determines whether or not the subframe identifier which is included in the first received subframe and the subframe identifier which is included in the second received subframe satisfy a predetermined sequence condition, and
   determining the subframe identifier of the first received subframe and the second received subframe to be correct if it is determined that the sequence condition is satisfied by the sequence determination.

4. The positioning signal receiving method according to claim 1, wherein the receiving includes storing data which is received in a ring buffer having a capacity in which at least two subframes can be stored.

5. A positioning signal receiving device comprising:
   a receiving circuit that is configured to receive a positioning signal by which subframes that include subframe identifiers of navigation message data and parity information are sequentially transmitted, wherein the subframe identifiers indicate a sequence of the subframes, and wherein each of the subframes corresponds to at least one word including a preamble, a message, and parity bits;
   a processor that is configured to:
      in response to acquiring a first word of a first received subframe, perform a first determination that determines whether or not an error occurs in a first word of the first received subframe based on the error detection information that is included in the first received subframe;
      in response to acquiring a second word of a second received subframe and in response to a determination that an error occurs in the first word, perform a second determination that determines whether or not an error occurs in the second word of the second received subframe based on the parity information that is included in the second received subframe, the second subframe being a subframe immediately next to the first subframe;
      determine that the subframe identifier of the second received subframe is correct if it is determined that an error does not occur in the second received subframe according to the second determination; and
      acquire a remainder of a navigation message based on the second subframe in response to the determination that the subframe identifier of the second received subframe is correct.

6. The positioning signal receiving device according to claim 5, wherein:
   if the processor determines that an error occurs in the first received subframe and the second received subframe, the processor
      determines whether or not the subframe identifier which is included in the first received subframe and the subframe identifier which is included in the second received subframe satisfy a predetermined sequence condition, and determines the subframe identifier of the first received subframe and the second received subframe to be correct if it is determined that the sequence condition is satisfied.

\* \* \* \* \*